United States Patent [19]

Mentone

[11] 3,770,594

[45] Nov. 6, 1973

[54] PLATING METAL ONTO SMALL FLEXIBLY BASED CONDUCTORS

[75] Inventor: Pat F. Mentone, St. Paul, Minn.

[73] Assignee: Buckbee-Mears Company, St. Paul, Minn.

[22] Filed: Dec. 10, 1971

[21] Appl. No.: 206,822

[52] U.S. Cl. .................................. 204/15, 204/228
[51] Int. Cl. .......................... C23b 5/48, B01k 3/00
[58] Field of Search ........................ 204/15, 228, 20

[56] References Cited

UNITED STATES PATENTS

| | | | |
|---|---|---|---|
| 1,527,734 | 2/1925 | Huggins | 204/228 |
| 2,046,440 | 7/1936 | Adey | 204/228 |
| 2,726,203 | 12/1955 | Rockafellow | 204/228 |
| 3,622,469 | 11/1971 | Alberts et al. | 204/15 |

*Primary Examiner*—T. Tufariello
*Attorney*—Marvin Jacobson and Carl L. Johnson

[57] ABSTRACT

A process for coating metals such as gold onto very small conductors, which conductors are bonded to flexible dielectric bases by immersing the conductors in a plating solution and applying current thereto in short separated pulses so as to avoid heating and electrolyzing the solution.

6 Claims, 5 Drawing Figures

PLATING METAL ONTO SMALL FLEXIBLY BASED CONDUCTORS

BACKGROUND OF THE INVENTION

In the prior art it is known to mass produce very small and very fine conductors by various techniques in which the final product comprises a flexible dielectric base upon which the very small conductors, which may be copper or the like, are bonded. In order to ensure a lasting and tenacious bond to the flexible dielectric base, it is necessary to utilize adhesives which are in themselves somewhat flexible so that they move with the flexible base. It is also known to be advantageous to plate certain coating metals on the surface of these conductors so as to make soldering or thermal compression bonding more successful. However, problems have been encountered in plating metals onto these conductors due to their very small size. Normally, metal plating and particularly gold plating can be easily achieved simply by immersing the conductor in a suitable plating solution. In the case of conductors of about 10 mils width and a half mil thickness or less, this approach has been encumbered by many difficulties and disadvantages due to the fact that plating solutions tend to soften and detach the flexible adhesives due to mount these small conductors on flexible bases. Since the area of contact between the small conductor and its flexible base is quite small, small deteriorations of the adhesive can result in the conductor floating free of the base. Such deteriorations of the adhesive result from a number of causes including high plating bath temperatures, further heating of the plating solution by the applied current, and the generation of small gas bubbles in and around the adhesive junction when the water is electrolyzed due to excess current in the plating solution. The present invention proposes a process which avoids the above problems as described below.

SUMMARY OF THE INVENTION

Briefly, my invention contemplates a new process for the plating of metals such as gold onto very small conductors which are bonded to flexible dielectric substrates. According to the process of my invention, the metal is plated on in a solution bath through the application of current in intermittent pulses. Under continuous plating conditions, the solution immediately adjoining the conductors is normally depleted of plating ions rather quickly so that the continuing application of current achieves less efficient plating. The excess current results only in heating the solution and electrolyzing the water. In the present invention, however, the current is applied in pulses, each pulse adding a small amount of a plating metal to the conductor. The pulse is then terminated and a rest period is provided during which the plating solution can replenish ions in the immediate vicinity of the conductor. Thus, no current is wasted in heating or electrolyzing the plating solution. Also, cooler plating baths can be used since higher temperature baths to encourage ion migration are not necessary. As a consequence the adhesives between the conductor and the flexible base do not become injured and the small conductor remains firmly attached to the flexible base. In addition, a purer deposit of metal is provided so that when the conductor is later connected to another conductor, improved performance is experienced. This is especially true in the case of thermal compression bonding where gold plated conductors are simply compressed together under high temperatures and pressures to weld the gold coatings together. In this process it is not only desirable that a very pure gold deposit be utilized but that the underlying circuit be firmly bonded to its dielectric base so as to withstand the temperatures and pressures involved in the bonding process. Thus, it may be seen that it is an object of the present invention to provide an improved process for plating metals, particularly gold, onto very small conductors which conductors are mounted on flexible dielectric bases. Further objects and advantages will become apparent upon consideration of the following description and drawings.

DESCRIPTION OF THE PREFERRED EMBODIMENT

Figure 1A:
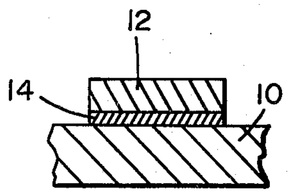
Fig. 1a (PRIOR ART)
FIGS. 1*a*, 1*b*, and 1*c* show the typical difficulties encountered in the prior art process for plating gold onto very small flexibly based conductors.
Figure 1B:
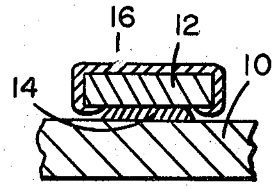
Fig. 1b (PRIOR ART)
Figure 1C:
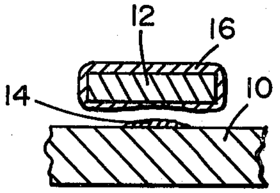
Fig. 1c (PRIOR ART)
Figure 2:
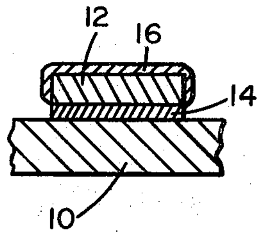
FIG. 2 shows the resultant product produced by the process of my invention.

In FIG. 1*a*, a typical small conductor 12 is mounted on a suitable flexible dielectric substrate 10. Conductor 12 may comprise copper or any other suitable electrically conductive metal and is bonded to substrate 10 by means of a suitable thermal setting adhesive 14 which is flexible enough to provide good bonding to the flexible base 10. If conductor 12 is plated with a covering metal 16, such as shown in FIG. 1*b*, it has been found that the plating process deteriorates and removes the adhesive 14 from the conductor 12 as shown. High plating bath temperatures, typically around 170° F., weaken the adhesive. The generation of additional heat and gas bubbles in the plating solution continues to degrade the adhesive connection between conductor 12 and base 10 until the situation shown in FIG. 1*c* finally develops wherein the conductor is floating free and clear from its base. It would be preferable to have a process wherein the adhesive 14 would not be affected at all so that the product shown in FIG. 2 could be produced. In FIG. 2 it may be seen that the adhesive 14 is intact and the conductor 12 is coated with a gold layer 16. The process of my invention achieves this end.

Figure 3:
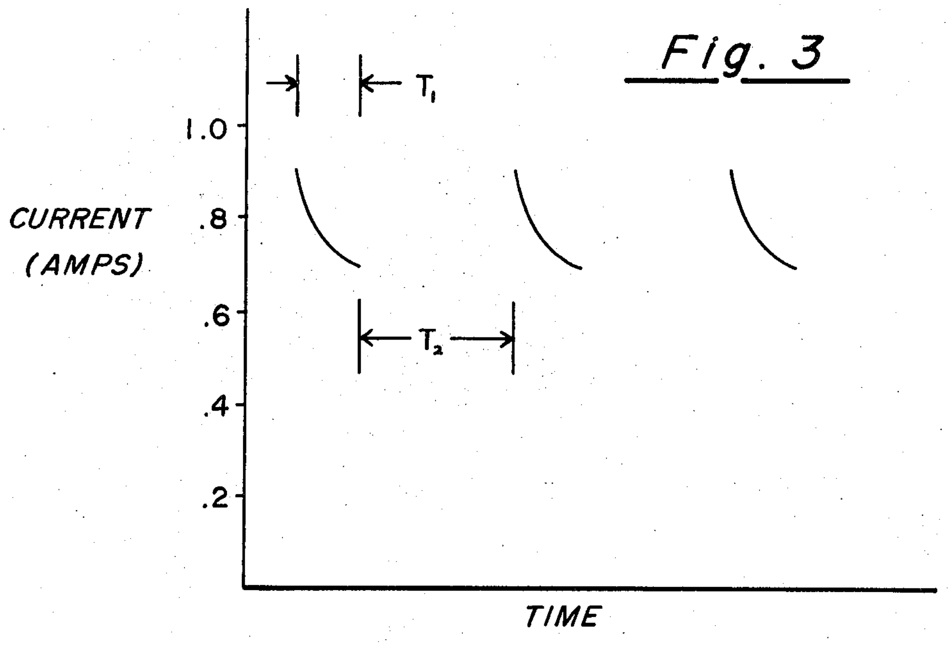
FIG. 3 is a graph showing generally how the plating current of the present invention is pulsed with respect to time.

As stated before, the flexibly mounted conductor is immersed in plating solution but the current is applied in pulses which are short and controlled in magnitude so as to avoid any heating or electrolyzing of the plating solution. As shown in FIG. 3, the pulses last for a period of time designated $T_1$. During that interval they are caused to taper off as the ions in the immediate vicinity of the conductor are depleted. This tapering off effect is accomplished by maintaining the applied voltage to the solution at a constant level which, in the preferred embodiment, is about 2.1 volts. Thus, as the plating ions are depleted and the resistance increases the current drops until terminated at the end of period $T_1$. Suitable electronic apparatus to accomplish this end is described in full in a co-pending application, Ser. No. 222,221 filed in the name of Roger A. Olson et al. and entitled "Power Supply for Pulse Electroplating" on Jan. 31, 1972 It has been found that the interval $T_1$ may range anywhere from 1 to about 20 milliseconds with a preferred time being approximately 10 milliseconds. The pulse is then terminated and no plating current is applied for an interval of time $T_2$ during which the plating solution can circulate enough to replenish ions in the immediate vicinity of the conductor 12. This ion replenishing period alleviates the need for high temperature baths so that the bath of the present invention can operate at a much cooler temperature in the range of, for example, 110° F. The interval $T_2$ in the preferred embodiment can range anywhere from about 20 to about 120 milliseconds with the preferred length of time being about 30 milliseconds. After the period $T_2$, another pulse is applied followed by another rest period, and so on to provide a highly pure deposit on conductor 12 without any deterioration of the adhesive bond 14.

I claim:

1. A process for coating metals onto very small conductors adhesively bonded to flexible dielectric bases comprising the steps of immersing said conductors after they are adhesively bonded to said flexible dielectric bases in a plating solution bath and directing plating current therethrough intermittently in pulses of sufficient duration and frequency to plate the conductors without heating and electrolyzing the plating solution to a degree to harmfully affect the adhesive bond.

2. The process of claim 1 in which said pulses are of the duration of from about 1 to about 20 milliseconds and in which said pulses are separated in time by a period of about 20 to 120 milliseconds.

3. The process of claim 2 in which said pulses are about 10 milliseconds in length spaced by a period of about 30 milliseconds.

4. The process of claim 1 in which said plating current is applied at a constant voltage.

5. The process of claim 3 in which said plating current is applied at a constant voltage.

6. The process of claim 5 in which said voltage is about 2.1 volts.

* * * * *